(12) United States Patent
Kikuchi et al.

(10) Patent No.: US 8,350,312 B2
(45) Date of Patent: Jan. 8, 2013

(54) SEMICONDUCTOR DEVICE

(75) Inventors: Shoko Kikuchi, Kawasaki (JP); Takafumi Ikeda, Yokohama (JP); Kazuhiro Shimizu, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 12/871,362

(22) Filed: Aug. 30, 2010

(65) Prior Publication Data

US 2011/0204426 A1 Aug. 25, 2011

(30) Foreign Application Priority Data

Feb. 25, 2010 (JP) ................. 2010-040614

(51) Int. Cl.
*H01L 27/108* (2006.01)
(52) U.S. Cl. . 257/315; 257/321; 257/324; 257/E29.304; 257/E29.309
(58) Field of Classification Search .................. 257/315, 257/321, 324, E29.304, E29.309
See application file for complete search history.

(56) References Cited

U.S. PATENT DOCUMENTS
2007/0012989 A1 1/2007 Yoshikawa

FOREIGN PATENT DOCUMENTS
JP 2002-141469 5/2002
JP 2008-283134 11/2008

OTHER PUBLICATIONS

Office Action issued Aug. 17, 2011, in Korean Patent Application No. 10-2010-0085934 (with English-language translation).

*Primary Examiner* — Minh-Loan T Tran
(74) *Attorney, Agent, or Firm* — Oblon, Spivak, McClelland, Maier & Neustadt, L.L.P.

(57) ABSTRACT

According to one embodiment, a semiconductor device includes a stacked structure that is formed by laminating a first insulating film, first conductive layer, second insulating film and second conductive layer on a semiconductor substrate and in which the first and second conductive layers are connected with a via electrically, an interlayer insulating film formed to electrically separate the second conductive layer into a first region including a connecting portion with the first conductive layer and a second region that does not include the connecting portion, a first contact plug formed on the first region and a second contact plug formed on the second region. An isolation insulating film is buried in portions of the substrate, first insulating film and first conductive layer in one peripheral portion on the second region side of the stacked structure and the second contact plug is formed above the isolation insulating film.

6 Claims, 5 Drawing Sheets

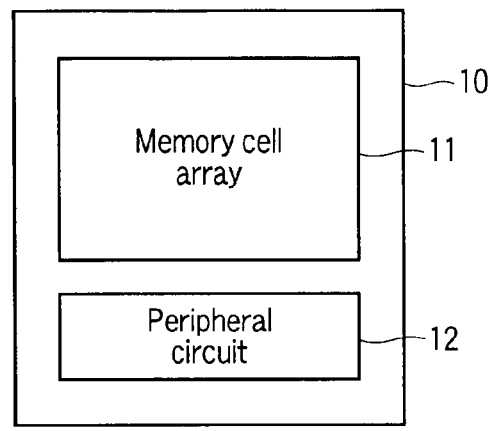
F I G. 1
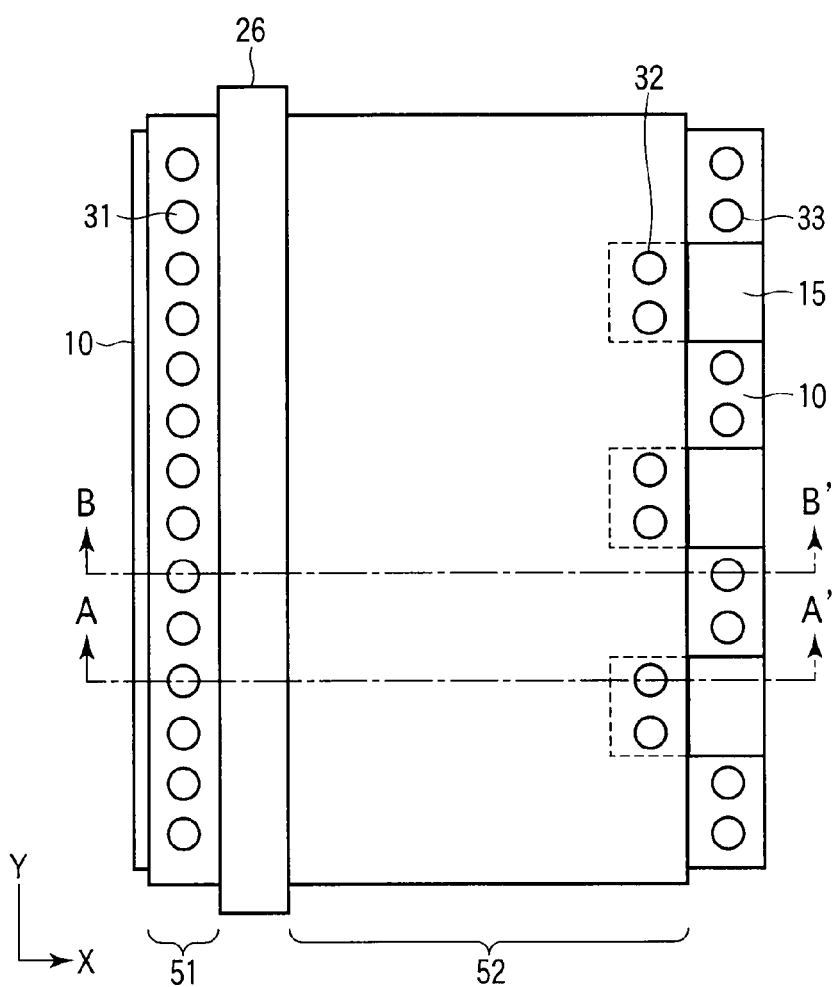
F I G. 2

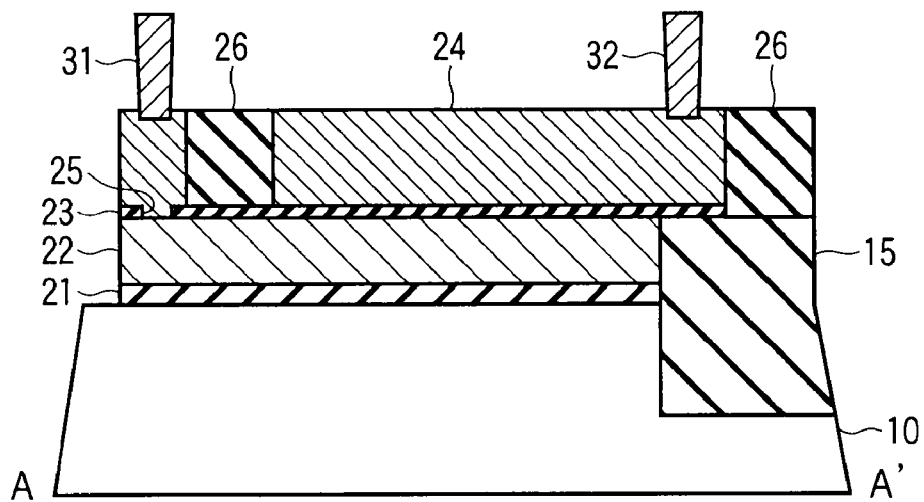
F I G. 3A
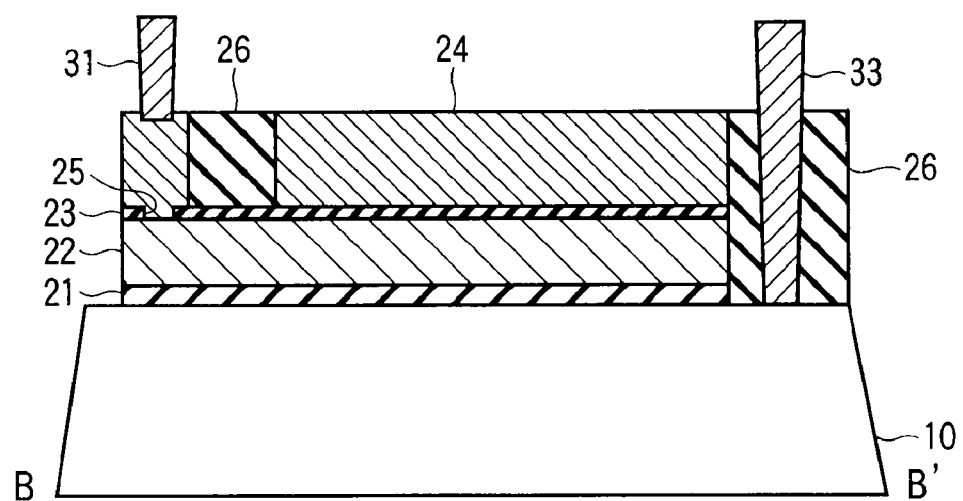
F I G. 3B

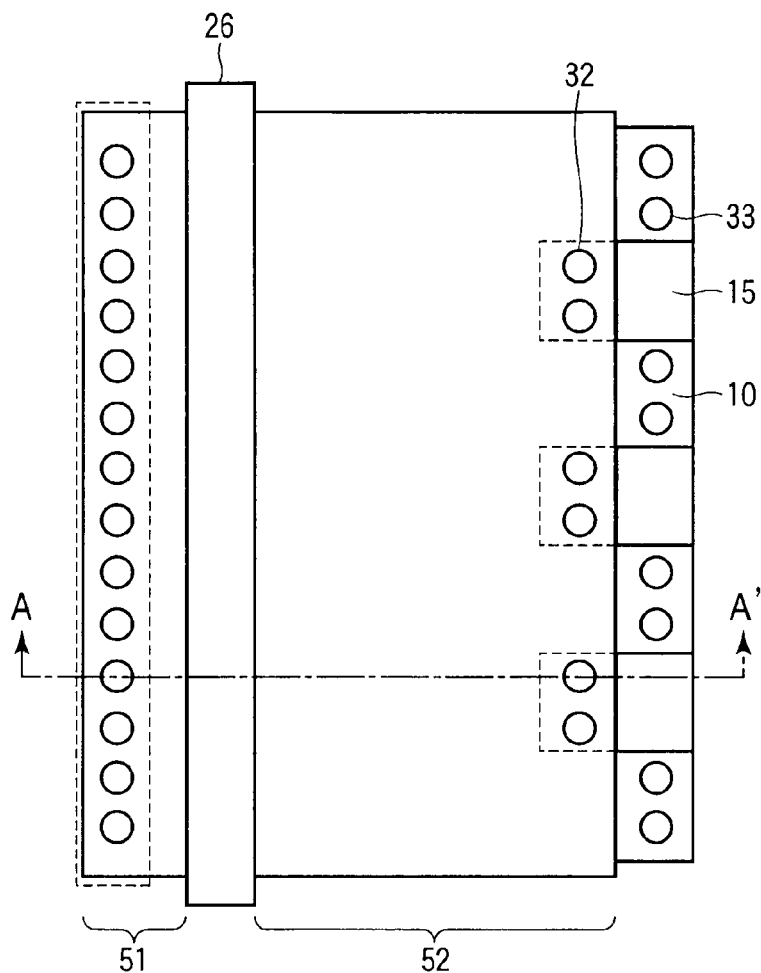
F I G. 4A
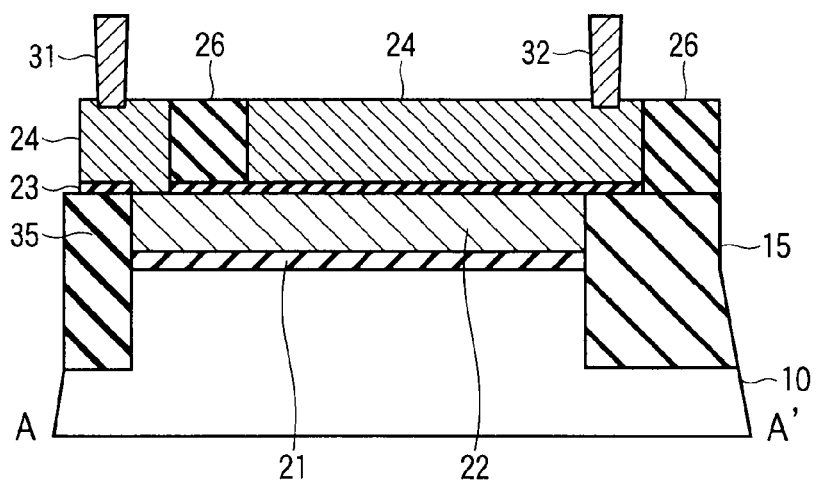
F I G. 4B

SEMICONDUCTOR DEVICE

CROSS-REFERENCE TO RELATED APPLICATIONS

This application is based upon and claims the benefit of priority from Japanese Patent Application No. 2010-040614, filed Feb. 25, 2010; the entire contents of which are incorporated herein by reference.

FIELD

Embodiments described herein relate generally to a semiconductor device having a stacked structure that is the same as the structure of a memory cell with a two-layered gate structure.

BACKGROUND

In a nonvolatile semiconductor memory device including memory cells with two-layered gate structures, capacitors in a peripheral circuit portion are each formed by use of a laminated film having a tunnel insulating film, floating gate electrode, interelectrode insulating film and control gate electrode formed on a silicon substrate like a memory cell portion. That is, the control gate electrode is separated by an interlayer insulating film, one of the separated regions is electrically connected to the floating gate electrode, a first contact plug is connected to the upper portion of one of the regions of the control gate electrode, a second contact plug is connected to the upper portion of the other region of the control gate electrode and a third contact plug is connected to the silicon substrate. Further, capacitors are formed between the floating gate electrode and the control gate electrode and between the floating gate electrode and the substrate.

At present, an intermetallic compound formed by use of silicon and a metal element is used as the control gate electrode. Particularly, since nickel silicide that is an intermetallic compound with nickel has low resistance and relatively high activation energy for silicide growth, it is desirably used as the control gate electrode.

However, in this type of silicide electrode, polycrystalline silicide crystal grains are condensed in the heat treatment at high temperatures and the uniformity of the structure and composition may be degraded in some cases. If the silicide electrode that is the control gate electrode is condensed and is non-uniformly formed, a contact plug penetrates a silicide-unformed portion of the control gate electrode to reach the lower-level interelectrode insulating film when the contact plug (second contact plug) is formed on the control gate electrode. Therefore, there occurs a problem that the control gate electrode and the floating gate electrode are short-circuited.

With respect to the example where capacitors are formed only between the floating gate electrode and the control gate electrode, a configuration is proposed wherein a contact plug is provided above an element isolation region (Jp-A 2002-141469(KOKAI)). However, this document does not disclose anything about the configuration wherein capacitors are formed between the floating gate electrode and the substrate as well, a conductive line leading from a third contact plug formed on the semiconductor substrate is provided, and that conductive line is connected to a second contact plug leading to the control gate electrode. In addition, the document does not discuss the problem wherein a silicide electrode may be condensed.

BRIEF DESCRIPTION OF THE DRAWINGS

FIG. 1 is a block diagram showing the basic configuration of a nonvolatile semiconductor memory device according to a first embodiment.

FIG. 2 is a plan view showing the schematic structure of a capacitor portion used in the nonvolatile semiconductor memory device according to the first embodiment.

FIGS. 3A and 3B are cross-sectional views respectively taken along lines A-A' and B-B' of FIG. 2.

FIGS. 4A and 4B are a plan view and cross-sectional view showing the schematic structure of a capacitor portion used in a nonvolatile semiconductor memory device according to a second embodiment.

DETAILED DESCRIPTION

Figure 5A:
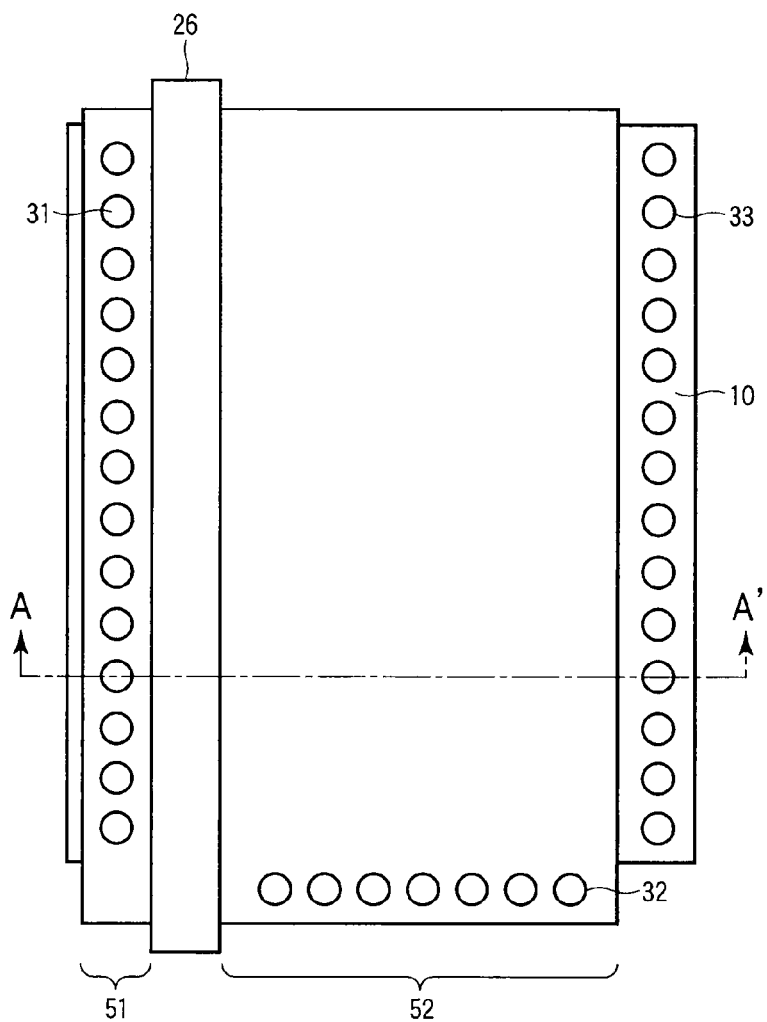
FIGS. 5A and 5B are a plan view and cross-sectional view showing the schematic structure of a capacitor portion used in a nonvolatile semiconductor memory device according to a third embodiment.

In general, according to embodiments, a semiconductor device includes a stacked structure portion formed by sequentially laminating a first insulating film, first conductive layer, second insulating film and second conductive layer in this order on a semiconductor substrate, the first and second conductive layers being electrically connected via a groove formed in the second insulating film, an interlayer insulating film formed to electrically separate the second conductive layer into a first region including a connecting portion with the first conductive layer and a second region that does not include the connecting portion, a first contact plug formed on the first region, a second contact plug formed on the second region, and a third contact plug formed on the semiconductor substrate. A first element isolation insulating film is buried and formed in portions of the semiconductor substrate, first insulating film and first conductive layer in one peripheral portion on the second region side of the stacked structure portion and the second contact plug is formed above the first element isolation insulating film.

Next, the embodiments are explained in detail with reference to the accompanying drawings.

First Embodiment

FIG. 1 is a block diagram showing the basic configuration of a nonvolatile semiconductor memory device according to a first embodiment.

A memory cell array (memory cell portion) 11 and a peripheral circuit portion 12 in which various transistors and capacitors are provided are arranged on a silicon substrate (semiconductor substrate) 10. The memory cell array 11 is attained by arranging NAND cell units in an array form each of which includes plural series-connected nonvolatile memory cells with two-layered gate structures each including a floating gate electrode and control gate electrode. The transistors and capacitors of the peripheral circuit portion 12 are formed with the same structure as the gate structure of the memory cell for simplifying the manufacturing process.

The capacitor of the peripheral circuit portion 12 is configured as shown in FIG. 2, FIG. 3A and FIG. 3B. FIG. 2 is a plan view showing the schematic structure of a capacitor having a gate stacked structure used in this embodiment.

FIGS. 3A and 3B are cross-sectional views respectively taken along lines A-A' and B-B' of FIG. 2.

A floating gate electrode (first conductive layer) 22 formed of polysilicon or the like is formed above a part of the silicon substrate 10 while a tunnel insulating film (first insulating film) 21 formed of a silicon oxide film or the like is disposed therebetween. The right end portions of the floating gate electrode 22 and tunnel insulating film 21 and a part of the substrate 10 are etched to form a groove and an element isolation insulating film (first element isolation insulating film) 15 formed of a silicon oxide film or the like is buried and formed in the groove. In this case, as is understood from the plan view of FIG. 2, the element isolation insulating film 15 is not formed continuously in the Y-direction (vertical direction in the drawing) but is formed at a plurality of positions that are separate from one another in the Y-direction and spaced at equal intervals. As a result, the floating gate electrodes 22 and element isolation insulating films 15 are alternately arranged along the Y-direction in the right end portion of the floating gate electrode 22. Further, on the right side with respect to the forming region of the floating gate electrodes 22, exposed portions of the substrate surface and the element isolation insulating films 15 are alternately arranged along the Y-direction.

A control gate electrode (second conductive layer) 24 is formed on a part of the floating gate electrode 22 and element isolation insulating film 15 with an interelectrode insulating film (second insulating film) 23 disposed therebetween. As the interelectrode insulating film 23, a stacked structure (ONO film) of an oxide film/nitride film/oxide film or a silicon nitride film having a dielectric constant larger than that of the tunnel insulating film can be used. As the control gate electrode 24, a metal silicide film can be used but, particularly, a nickel silicide film can be adequately used.

As shown in FIG. 2, the stacked structure portion configured by the tunnel insulating film 21, floating gate electrode 22, interelectrode insulating film 23 and control gate electrode 24 is formed in a rectangular form. On the right end portion of the stacked structure portion, the floating gate electrode 22 and tunnel insulating film 21 are formed to have irregular shapes.

A groove is formed in the left position with respect to the central portion of the control gate electrode 24 to separate the gate electrode 24 into a first region 51 on the left side and a second region 52 on the right side and an interlayer insulating film (first interlayer insulating film) 26 is formed in the groove. In the left position with respect to the interlayer insulating film 26, that is, in the first region 51, a portion of the interelectrode insulating film 23 is removed to form an opening portion (connecting portion) 25. The floating gate electrode 22 and control gate electrode 24 are electrically connected via the opening portion 25.

A plurality of first contact plugs 31 are connected to portions of the control gate electrode 24 that lie in the left position with respect to the interlayer insulating film 26, that is, in the first region 51 and lie above portions in which the interelectrode insulating film 23 is removed. A plurality of second contact plugs 32 are connected to portions lying above the element isolation insulating film 15 and in the right position with respect to the interlayer insulating film 26, that is, in the second region 52. Further, a plurality of third contact plugs 33 are connected to the upper portions of the silicon substrate 10 in positions adjacent to the right end portion of the stacked structure portion and adjacent to the element isolation insulating film 15. The arrangement directions of the first to third contact plugs 31 to 33 are set in the Y-direction.

With the above structure, the control gate electrode 24 and floating gate electrode 22 can be prevented from being short-circuited even if the contact plug 32 penetrates the interelectrode insulating film 23 by forming the second contact plugs 32 above the element isolation insulating film 15. That is, a short circuit occurring at the contact formation time can be prevented by changing the arrangement of the contact plugs of the capacitors and the structure of the lower layer of the contact plug. Therefore, the element reliability can be enhanced.

The above effect will be explained more in detail in the following. When a nickel silicide layer is used as the control gate electrode 24, a polysilicon film is deposited on the interelectrode insulating film 23 and a nickel film is deposited thereon. Then, the heat treatment is performed to modify the film into a silicide form and thus a nickel silicide layer is formed. At this time, the wider the polysilicon pattern is, the more notably polycrystalline silicide crystal grains are condensed. Thus, the uniformity of the structure and composition will be degraded. That is, a silicide electrode that is the control gate electrode 24 is condensed and is non-uniformly formed. When the contact plugs 32 are formed on the control gate electrode 24, the contact plug 32 penetrates the control gate electrode 24 in a silicide-unformed portion to reach the lower-level interelectrode insulating film 23. In this case, if the floating gate electrode 22 has been arranged right under the interelectrode insulating film 23, the control gate electrode 24 and floating gate electrode 22 are short-circuited.

In this embodiment, since the second contact plugs 32 are formed above the element isolation insulating film 15, the control gate electrode 24 and floating gate electrode 22 can be prevented from being short-circuited even if penetration occurs.

Further, in this embodiment, a capacitor formed between the substrate 10 and the floating gate electrode 22 and a capacitor formed between the second region 52 of the control gate electrode 24 and the floating gate electrode 22 are connected in parallel by electrically connecting the second and third contact plugs 32 and 33. As a result, the capacitance of the capacitor can be increased. Further, in this embodiment, since the second contact plugs 32 are arranged adjacent to the third contact plugs 33, an advantage that interconnections that connect the contact plugs can be easily formed is attained.

The ratio of the second contact plugs 32 to the third contact plugs 33 is not necessarily set to the same value. Further, the ratio of the first contact plugs 31 to the second and third contact plugs 32, 33 is not necessarily set to the same value.

Second Embodiment

FIGS. 4A and 4B depict the structure of a main portion of a nonvolatile semiconductor memory device according to a second embodiment, FIG. 4A being a plan view and FIG. 4B a cross-sectional view taken along line A-A' of FIG. 4A. Portions that are the same as those of FIG. 2, FIG. 3A and FIG. 3B are denoted by the same symbols and detailed explanation thereof is omitted.

This embodiment is different from the first embodiment explained before in that an element isolation insulating film (second element isolation insulating film) 35 is formed not only on the side of the second contact plugs 32 but also on the side of the first contact plugs 31. That is, a portion of the substrate 10 and the left end portions of the floating gate electrode and tunnel insulating film 21 are etched to form a groove and the element isolation insulating film 35 is buried and formed in the groove. The contact plugs 31 are positioned above the element isolation insulating film 35.

In this case, the element isolation insulating film 35 is formed of the same material as that used to simultaneously form the element isolation insulating film 15 and is continuously formed in the Y-direction. Further, a portion in which the interelectrode insulating film 23 is partly removed is formed in a position other than a portion above the element isolation insulating film 35.

With the above structure, the same effect as that of the first embodiment can of course be attained and the following effect can also be attained. That is, the floating gate electrode 22 and semiconductor substrate 10 can be prevented from being short-circuited even if penetration of the first contact plug 31 occurs by forming the contact plugs 31 above the element isolation insulating film 35. Therefore, a problem caused not only by penetration of the second contact plugs 32 but also by penetration of the first contact plugs 31 can be solved and the reliability can be further enhanced.

Third Embodiment

Figure 5B:
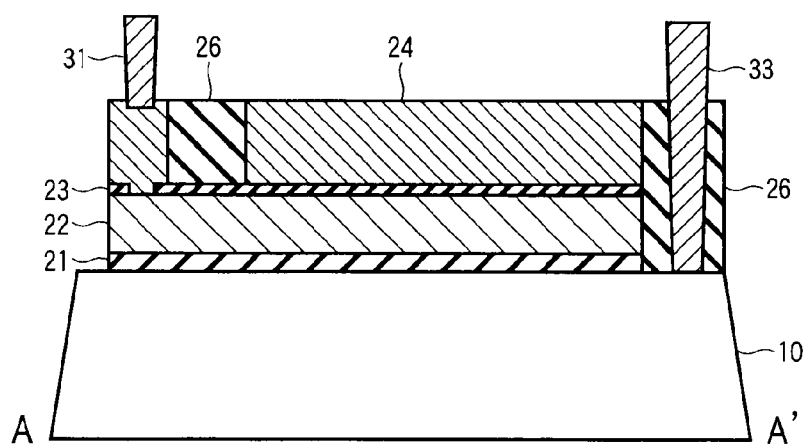

FIGS. 5A and 5B depict the structure of a main portion of a nonvolatile semiconductor memory device according to a third embodiment, FIG. 5A being a plan view and FIG. 5B a cross-sectional view taken along line A-A' of FIG. 5A. Portions that are the same as those of FIG. 2, FIG. 3A and FIG. 3B are denoted by the same symbols and detailed explanation thereof is omitted.

This embodiment is different from the first embodiment explained before in the formation positions of the second contact plugs 32 and third contact plugs 33.

In this embodiment, peripheral portions of one side (lower-side portion of FIG. 5A) of the control gate electrode 24 and interelectrode insulating film 23 are formed to extend onto an element isolation insulating film (not shown). That is, in the lower-side portion of the stacked structure portion, the element isolation insulating film formed of a silicon oxide film or the like is buried and formed in portions of the substrate 10, tunnel insulating film 21 and floating gate electrode 22. Further, second contact plugs 32 are formed in the above portion. That is, the second contact plugs 32 are formed in the lower-side peripheral portion of a second region 52 of the control gate electrode 24 above the element isolation insulating film.

Further, on the right side of the stacked structure portion, portions of the floating gate electrode 22 and tunnel insulating film 21 are not removed in an irregular form but are formed in substantially a straight form like the control gate electrode 24 and interelectrode insulating film 23. Third contact plugs 33 are connected to the silicon substrate 10 in a region adjacent to the right side of the stacked structure portion. As in the first embodiment, first contact plugs 31 are connected to a first region 51 of the control gate electrode 24. In this case, as in the second embodiment, it is possible to form an element isolation insulating film 35 on the side of the first region 51 and form the first contact plugs 51 above the element isolation insulating film 35.

Thus, according to this embodiment, the control gate electrode 24 and the floating gate electrode 22 can be previously prevented from being short-circuited as in the first embodiment even if the second contact plug 32 penetrates the interelectrode insulating film 23 by forming the contact plugs 32 above the element isolation region on the capacitor end portion. Therefore, the same effect as that of the first embodiment can be attained.

In this embodiment, there occurs a possibility that the interconnection process after formation of the contact plugs becomes complicated in comparison with that of the conventional structure by forming the second and third contact plugs 32 and 33 on different sides extending in directions perpendicular to each other. However, the second contact plugs 32 can be formed above the element isolation region without selectively removing some of the second and third contact plugs 32 and 33. Therefore, an advantage that the contact resistance can be reduced is attained.

Fourth Embodiment

Figure 6A:
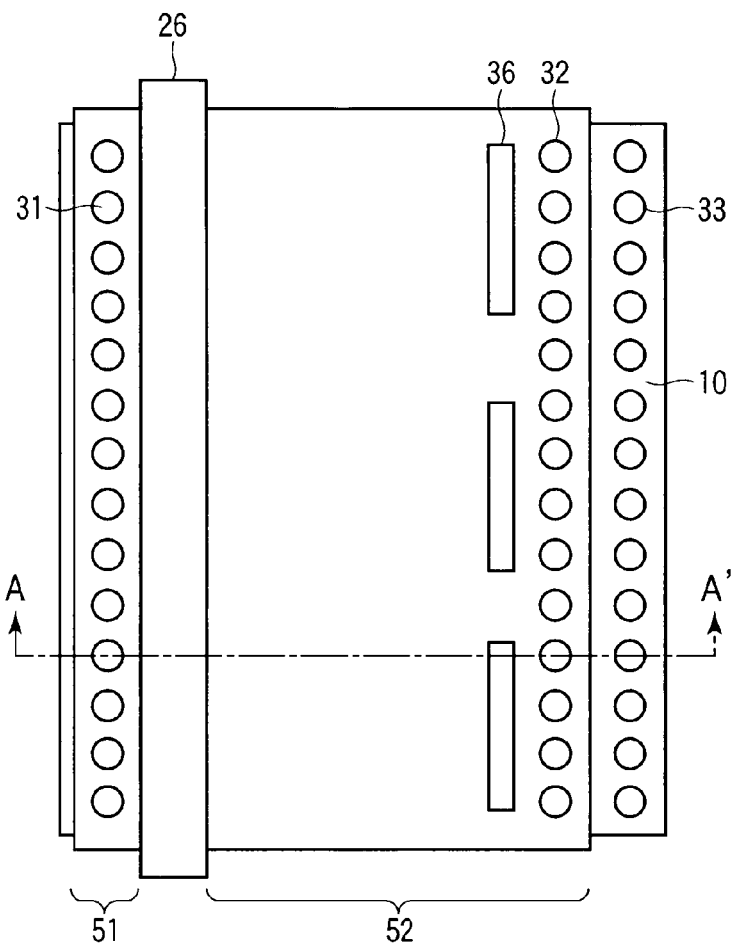
FIGS. 6A and 6B are a plan view and cross-sectional view showing the schematic structure of a capacitor portion used in a nonvolatile semiconductor memory device according to a fourth embodiment.
Figure 6B:
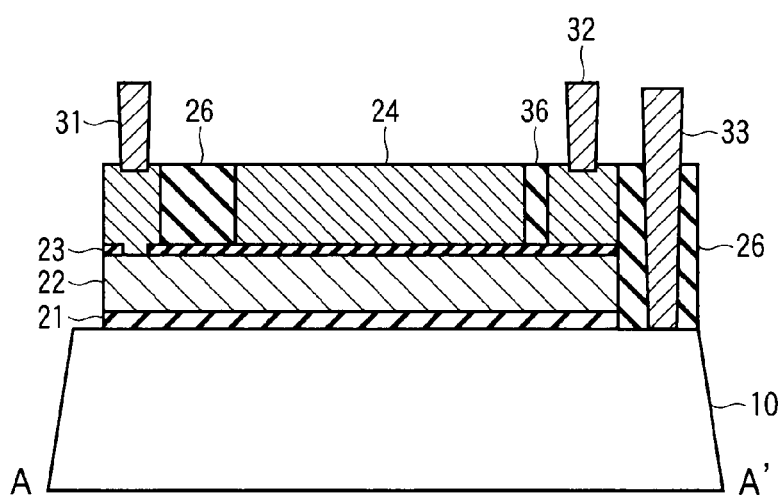

FIGS. 6A and 6B depict the structure of a main portion of a nonvolatile semiconductor memory device according to a fourth embodiment, FIG. 6A being a plan view and FIG. 6B a cross-sectional view taken along line A-A' of FIG. 6A. Portions that are the same as those of FIG. 2, FIG. 3A and FIG. 3B are denoted by the same symbols and detailed explanation thereof is omitted.

This embodiment is different from the third embodiment explained before in the formation positions of the second contact plugs 32 and in that an interlayer insulating film (second interlayer insulating film) 36 is newly formed.

That is, the second contact plugs 32 are formed in a peripheral portion on the right side of the control gate electrode 24. On the right side of the stacked structure portion, portions of the floating gate electrode 22 and tunnel insulating film 21 are not removed in an irregular form but are formed in substantially a straight form like the control gate electrode 24 and interelectrode insulating film 23. The interlayer insulating film 36 is buried and formed in a portion of the contact gate electrode 24 in a position near the second contact plugs 32 between the second contact plugs 32 and the interlayer insulating film 26. The interlayer insulating film 36 is not continuously formed but is intermittently formed in the Y direction-direction unlike the interlayer insulating film 26. Further, the width of the interlayer insulating film 36 is made smaller than that of the interlayer insulating film 26.

Specifically, an insulating film is deposited as an interlayer insulating film on the interelectrode insulating film 23 before forming a control gate electrode 24 and the insulating film is formed into a desired pattern to simultaneously form interlayer insulating films 26, 36. Then, after a poly silicon film and nickel film are deposited on the exposed portion of the interelectrode insulating film 23, the heat treatment is performed to form a control gate electrode 24 formed of nickel silicide.

In this case, if a part or the entire portion of the control gate electrode 24 is formed of silicide, silicide is condensed by various causes such as the heat treatment, film thickness or volume of the formed electrode and may cause a faulty device. Therefore, silicide condensation in the peripheral portion of the second contact plugs can be suppressed by reducing the volume of silicide formed near the second contact plugs. That is, the volume of silicide of the control gate electrode 24 connected to the second contact plugs 32 can be apparently reduced by removing a portion of the control gate electrode 24 in a portion near the region in which the second contact plugs 32 are formed. As a result, silicide can be uniformly formed, and therefore, penetration of the second contact plug 32 can be suppressed.

As in the second embodiment, in this embodiment, an element isolation insulating film 35 may be formed on the side of the first region 51 and the first contact plugs 31 may be formed above the element isolation insulating film 35.

Thus, according to this embodiment, the control gate electrode 24 in which the second contact plugs 32 are formed can be uniformly formed while a reduction in the capacitance of the capacitor can be suppressed to a minimum by burying the interlayer insulating film 36 in the control gate electrode 24 in a portion near the second contact plugs 32. Therefore, the contact plug 32 can be prevented from penetrating the control gate electrode 24 and interelectrode insulating film 23.

Further, as in the third embodiment, in this embodiment, since the contact plugs can be formed without selectively removing some of the second and third contact plugs 32 and 33, an advantage that the contact resistance can be reduced is attained. In addition, an advantage that complication of the process caused by formation of the interlayer insulating film 36 can be prevented by forming the interlayer insulating film 36 at the same time as formation of the interlayer insulating film 26 can be attained.

Modification

This invention is not limited to the above embodiments. The substrate is not limited to the silicon substrate and a semiconductor substrate on which memory cells can be formed may be used. Further, an SOI substrate in which a silicon layer is formed on an insulating film may also be used.

Further, the numbers of the first to third contact plugs are not necessarily plural and can be set to one if sufficiently good contacts can be attained.

The memory cell unit configuring the memory cell portion is not limited to the NAND type but can be applied to a NOR type. In short, it is only required to use the memory cell that may be a nonvolatile semiconductor memory cell having a two-layered gate structure with a floating gate electrode and control gate electrode.

Further, the nonvolatile semiconductor memory device is provided as an example in the above embodiments, but the embodiments are not necessarily limited to the above device and can be applied to a semiconductor device having a stacked structure portion formed by laminating a first insulating film, first conductive layer, second insulating film and second conductive layer on a semiconductor substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
  a stacked structure portion formed by sequentially laminating a first insulating film, first conductive layer, second insulating film and second conductive layer in an order described above on a semiconductor substrate, the first conductive layer and the second conductive layer being electrically connected via a groove formed in the second insulating film,
  an interlayer insulating film formed to electrically separate the second conductive layer into a first region of a small area including a connecting portion with the first conductive layer and a second region of a large area that does not include the connecting portion,
  a first element isolation insulating film formed in one peripheral portion on the second region side of the stacked structure portion, the first element isolation insulating film being buried and formed in portions of the semiconductor substrate, first insulating film and first conductive layer,
  a first contact plug formed on the first region,
  a second contact plug formed on the second region, the second contact plug being formed above the first element isolation insulating film, and
  a third contact plug formed on the semiconductor substrate, the third contact plug being formed in a region adjacent to a peripheral portion different from the one peripheral portion on the second region side of the stacked structure portion.

2. The device according to claim 1, further comprising a second element isolation insulating film buried and formed in portions of the semiconductor substrate, first insulating film and first conductive layer on the first region side of the stacked structure portion,
  wherein the first contact plug is formed above the second element isolation insulating film.

3. The device according to claim 1, wherein each of the first, second and third plugs includes a plurality of plugs and the respective plugs are arranged along one direction.

4. The device according to claim 3, wherein the first element isolation insulating film is formed along a boundary of the one peripheral portion of the stacked structure portion.

5. The device according to claim 1, wherein the first insulating film corresponds to a tunnel insulating film, the first conductive layer corresponds to a floating gate electrode, the second insulating film corresponds to an interelectrode insulating film and the second conductive layer corresponds to a control gate electrode.

6. The device according to claim 5, wherein a first capacitor is formed between the first conductive layer and the semiconductor substrate and a second capacitor is formed between the first conductive layer and the second region of the second conductive layer.

* * * * *